(12) United States Patent
Jang et al.

(10) Patent No.: US 8,933,505 B2
(45) Date of Patent: Jan. 13, 2015

(54) THREE-DIMENSIONAL SEMICONDUCTOR MEMORY DEVICE

(71) Applicants: Sunghoi Hur, Seoul (KR); Jinho Kim, Hwaseong-si (KR); Sunil Shim, Seoul (KR); Su-Youn Yi, Yongin-si (KR); HuiChang Moon, Yongin-si (KR)

(72) Inventors: Younggoan Jang, Anyang-si (KR); Sunghoi Hur, Seoul (KR); Jinho Kim, Hwaseong-si (KR); Sunil Shim, Seoul (KR); Su-Youn Yi, Yongin-si (KR); HuiChang Moon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/898,032

(22) Filed: May 20, 2013

(65) Prior Publication Data

US 2013/0248983 A1 Sep. 26, 2013

Related U.S. Application Data

(63) Continuation of application No. 12/592,404, filed on Nov. 24, 2009, now Pat. No. 8,445,954.

(30) Foreign Application Priority Data

Nov. 25, 2008 (KR) .................. 10-2008-0117493

(51) Int. Cl.
*H01L 29/78* (2006.01)
*H01L 27/115* (2006.01)

(52) U.S. Cl.
CPC ...... *H01L 29/7827* (2013.01); *H01L 27/11551* (2013.01); *H01L 27/11556* (2013.01); *H01L 27/11578* (2013.01); *H01L 27/11582* (2013.01)
USPC .......................................... 257/329

(58) Field of Classification Search
USPC ......................................... 257/329
See application file for complete search history.

(56) References Cited

U.S. PATENT DOCUMENTS

| | | | |
|---|---|---|---|
| 2006/0091556 A1 | 5/2006 | Shigeoka | |
| 2007/0158736 A1 | 7/2007 | Arai et al. | |
| 2007/0257324 A1* | 11/2007 | Lee et al. | 257/384 |
| 2008/0237695 A1 | 10/2008 | Shino et al. | |
| 2009/0090959 A1* | 4/2009 | Nishihara et al. | 257/324 |
| 2010/0133606 A1 | 6/2010 | Jang et al. | |

FOREIGN PATENT DOCUMENTS

| | | |
|---|---|---|
| JP | 10-93083 | 4/1998 |
| JP | 2006-128390 | 5/2006 |
| JP | 2007-180389 | 7/2007 |

OTHER PUBLICATIONS

"Three-Dimensional Semiconductor Memory Device" Specification, Drawings, and Prosecution History, of U.S. Appl. No. 12/592,404, filed Nov. 24, 2009, by Younggoan Jang, et al.

* cited by examiner

*Primary Examiner* — Zandra Smith
*Assistant Examiner* — Lawrence Tynes, Jr.
(74) *Attorney, Agent, or Firm* — Onello & Mello, LLP

(57) ABSTRACT

A three-dimensional semiconductor memory device includes word lines and gate interlayer insulation layers that are alternatively stacked on a semiconductor substrate while extending in a horizontal direction, a vertical channel layer that faces the word lines and extends upwardly from the semiconductor substrate, and a channel pad that extends from the vertical channel layer and is disposed on an uppermost gate interlayer insulation layer of the gate interlayer insulation layers.

13 Claims, 15 Drawing Sheets

THREE-DIMENSIONAL SEMICONDUCTOR MEMORY DEVICE

CROSS-REFERENCE TO RELATED APPLICATIONS

This application is a continuation application of U.S. patent application Ser. No. 12/592,404, filed on Nov. 24, 2009, which claims the benefit of Korean Patent Application 10-2008-0117493, filed in the Korean Intellectual Property Office on Nov. 25, 2008, the entire contents of which applications are incorporated herein in their entirety by reference.

BACKGROUND OF THE INVENTION

The present inventive concept relates to a semiconductor device, and more specifically, to a three-dimensional semiconductor memory device.

Recently, increasing the integration degree of semiconductor devices is required to satisfy the increasing user demand for performance and low price. In semiconductor memory devices, since the integration degree is a significant factor in cost, it is especially important to increase the integration degree. In traditional two-dimensional or planar semiconductor memory devices, since the integration degree is determined by an amount of circuit area occupied by a unit memory cell, techniques for forming fine patterns have a great influence on the cost of semiconductor memory devices. However, since very expensive equipment is required to produce hyper-fine patterns, although the integration degree of two-dimensional memory semiconductor devices is increasing, this increase in integration degree is limited by the equipment cost.

As alternatives for overcoming these limitations, developments have been made on techniques for forming three-dimensional memory cells. According to these techniques, since the memory cells are formed three-dimensionally, the area of semiconductor substrate is more efficiently utilized. As a result, the integration degree may be greatly increased as compared to the traditional two-dimensional memory semiconductor devices. In addition, using these techniques, word lines are formed by using a patterning process to define an active region, thereby greatly reducing a manufacturing cost per stored memory bit.

SUMMARY OF THE INVENTION

The present inventive concept is directed to a three-dimensional semiconductor memory device and a method of forming the same.

A three-dimensional semiconductor memory device according to an exemplary embodiment of the present inventive concept includes: word lines and gate interlayer insulation layers that are alternately stacked on a semiconductor substrate while extending in a horizontal direction; a vertical channel layer that faces the word lines and extends upwardly from the semiconductor substrate; and a channel pad that extends from the vertical channel layer and is disposed on an uppermost gate interlayer insulation layer of the gate interlayer insulation layers.

In an embodiment, the vertical channel layer may contain the same materials as the channel pad.

In an embodiment, the channel pad may include a semiconductor layer on the uppermost gate interlayer insulation layer and a semiconductor-metal compound layer on the semiconductor layer.

In an embodiment, an upper surface of the channel pad may have an area larger than that of the vertical channel layer.

In an embodiment, the vertical channel layer may include: a body that is connected to the semiconductor substrate; and a drain region that is connected to the body and comes in contact with the channel pad.

In an embodiment, the drain region may include the same dopant as the channel pad.

In an embodiment, the three-dimensional semiconductor memory device may further include an insulation pillar that is disposed on the semiconductor substrate in contiguity with the vertical channel layer. In this case, the vertical channel layer may be disposed between the insulation pillar and the word lines.

In an embodiment, the three-dimensional semiconductor memory device may further include bit lines that extend in parallel with each other in a direction intersecting with the word lines and are electrically connected to the channel pad.

In an embodiment, the three-dimensional semiconductor memory device may further include bit line contacts that are interposed between the bit lines and the channel pad.

In an embodiment, the bit line contacts may be spaced apart from each other and may be disposed on the channel pad.

BRIEF DESCRIPTION OF THE DRAWINGS

The foregoing and other features and advantages of the inventive concept will be apparent from the more particular description of preferred aspects of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF PREFERRED EMBODIMENTS

Figure 1:
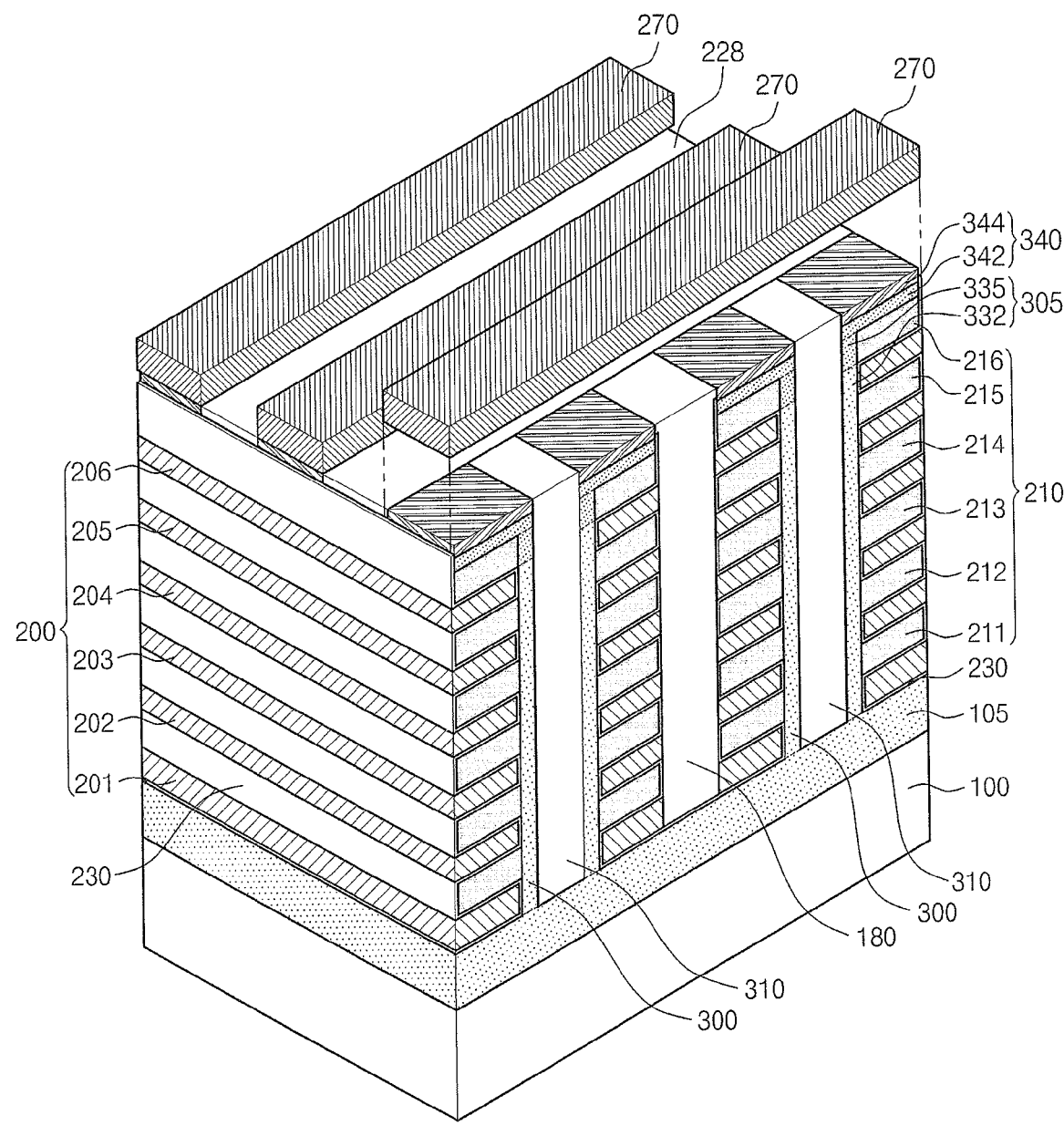
FIG. 1 is a schematic perspective view illustrating a three-dimensional semiconductor memory device according to an exemplary embodiment of the present inventive concept.

Preferred embodiments of the present inventive concept will be described below in more detail with reference to the accompanying drawings. The present inventive concept may, however, be embodied in different forms and should not be constructed as limited to the embodiments set forth herein. Rather, these embodiments are provided so that this description will be thorough and complete, and will fully convey the scope of the inventive concept to those skilled in the art.

It will be understood that, although the terms "first", "second", and so on may be used herein to describe certain, these components should not be limited by these terms. These terms are only used to distinguish one component from another component.

In the drawings, each of the components may have been exaggerated for clarity. Like reference numerals refer to like components throughout the specification.

Some embodiments to which the scope of the inventive concept can be applied are illustratively described below, but other modified embodiments will not be described for brevity. However, it will be apparent to those skilled in the art that various modification and changes may be made thereto without departing from the scope and spirit of the inventive concept based on the above description and following embodiments.

FIG. 1 is a schematic perspective view illustrating a three-dimensional semiconductor memory device according to an exemplary embodiment of the present inventive concept.

Referring to FIG. 1, a well region 105 is disposed on a semiconductor substrate 100. The well region 105 may have an n$^+$conductivity type. Word lines 201, 202, 203, 204, 205, and 206 and gate interlayer insulation layers 211, 212, 213, 214, 215, and 216 are alternatively stacked on the semiconductor substrate 100 to extend in a horizontal direction. The word lines 201 to 206 form a line structure 200, and the gate interlayer insulation layers 211 to 216 form a gate interlayer insulation structure 210. The word lines 201 to 206 may include conductive materials, for example, polysilicon and/or metal. The gate interlayer insulation layers 211 to 216 may include insulation materials, for example, silicon oxide or silicon nitride.

A plurality of vertical channel layers 305 face the word lines 201 to 206 and are disposed so as to extend vertically from the semiconductor substrate 100. The plurality of vertical channel layers 305 may have the same conductivity type as the well region 105. A gate insulation layer 230 is disposed between the vertical channel layer 305 and the word lines 201 to 206. The gate insulation layer 230 may include a tunnel insulation layer, a charge storage layer, and a blocking insulation layer. The charge storage layer may include a silicon nitride layer or a high-dielectric-constant layer capable of trapping charges.

The vertical channel layer 305 may include a body 332 using as a channel of the three-dimensional semiconductor memory device and a drain region 335 connected to the body 332. The drain region 335 may have a conductivity type different from the well region 105, while the body 332 may have the same conductivity type as the well region 105. The word lines 201 to 206 may be disposed in contiguity with each other so that inversion regions are overlapped with each other by a fringe field of an applied voltage.

The three-dimensional semiconductor memory device according to this embodiment of the present inventive concept may be an NAND flash memory device that forms one string configured by plurality of memory cells provided with the word lines 201 to 206 holding one vertical channel layer 305 in common. In this case, the lowest word line 201 of the word lines 201 to 206 may be a ground select line, and the uppermost word line 206 may be a string select line.

A channel pad 340 is disposed on the uppermost gate interlayer insulation layer 216 of the gate interlayer insulation layers 211 to 216. The upper surface of the channel pad 340 may have an area larger than that of the drain region 335 or that of the vertical channel layer 305. The channel pad 340 may include the same materials as the vertical channel layer 305. That is, the channel pad 340 may include semiconductor materials. According to this embodiment of the present inventive concept, the channel pad 340 may include a semiconductor pad 342 on the uppermost gate interlayer insulation layer 216 and a semiconductor-metal compound layer 344 on the semiconductor pad 342. The semiconductor-metal compound layer 344 may be a silicide layer. The semiconductor pad 342 may include the same dopant as the drain region 355.

The word lines 201 to 206 have first sidewalls adjacent to the vertical channel layer 305 and second sidewalls opposite to the first sidewalls. An insulation pillar 310 may be disposed between the first sidewalls adjacent to the vertical channel layers 305. That is, the vertical channel layer 305 may be disposed between the insulation pillar 310 and the word lines 201 to 206. A gap-fill insulation layer 180 may be disposed between the second sidewalls adjacent to the word lines 201 to 206. The three-dimensional semiconductor memory device may have a repeated mirror-symmetrical structure in the vertical direction of the word lines 201 to 206. That is, the structure comprising the word line structure 200 and the vertical channel layer 305 may be mirror-symmetrical with the adjacent structure comprising the word line structure 200 and the vertical channel layer 305 based on the insulation pillar 310, and the structure comprising the word line structure 200 and the vertical channel layer 305 may be mirror-symmetrical with the adjacent structure comprising the word line structure 200 and the vertical channel layer 305 based on the gap-fill insulation layer 180. An insulation-isolation pillar 228 is disposed between the insulation pillars 310 adjacent to each other and between the channel pads 340 adjacent to each other (see FIG. 12 and FIG. 13).

Bit lines 270 are disposed to be electrically connected to the channel pad 340 and extend in a direction intersecting with the word lines 201 to 206 in a parallel with each other. The bit lines 270 may include conductive materials. According to this embodiment of the present inventive concept, the channel pad 340 may reduce the resistance between the bit lines 270 and the vertical channel layer 305. Furthermore, the semiconductor-metal compound layer 344 forms an ohmic contact between the bit lines 270 and the vertical channel layer 305.

Figure 2:
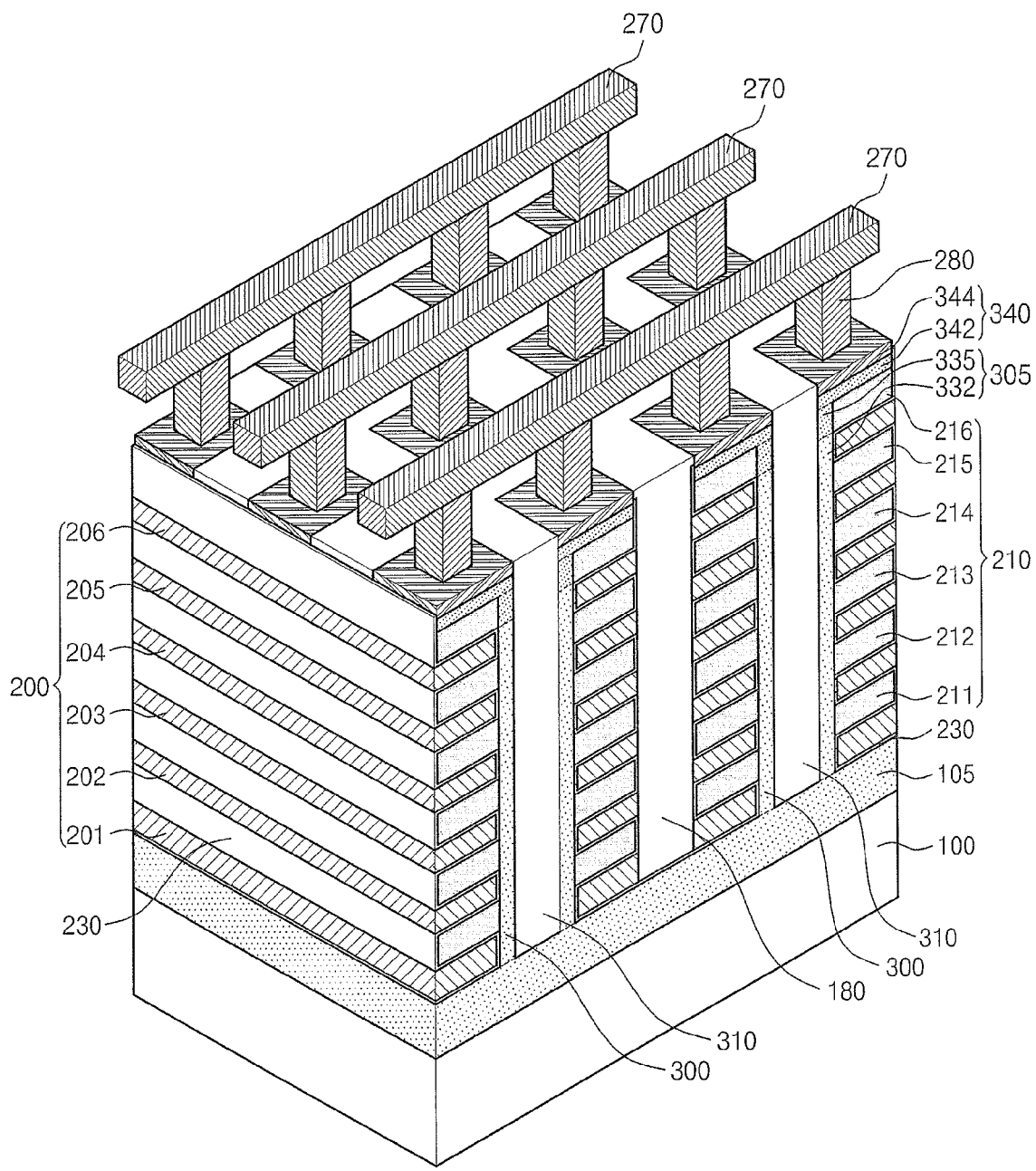
FIG. 2 is a schematic perspective view illustrating a three-dimensional semiconductor memory device according to another exemplary embodiment of the present inventive concept.

FIG. 2 is a schematic perspective view illustrating a three-dimensional semiconductor memory device according to another exemplary embodiment of the present inventive concept. FIG. 2 is a similar to the above-described embodiment except for the difference in contacts. Accordingly, with respect to like technical features, detailed description thereof will not be repeated.

As illustrated in FIG. 2, bit line contacts 280 are disposed between the bit lines 270 and the channel pads 340. The bit line contacts 280 may be disposed so as to each correspond one-to-one with the channel pads 340. Since the bit line contacts 280 come in contact with the channel pads 340 having a broad upper surface, wiring resistance is reduced. In addition, since the upper surface of the channel pads 340 is broad, alignment margin of the bit line contacts 280 is assured.

FIG. 3 to FIG. 14 illustrate a method of forming three-dimensional semiconductor memory devices according to exemplary embodiments of the present inventive concept.

Figure 3:
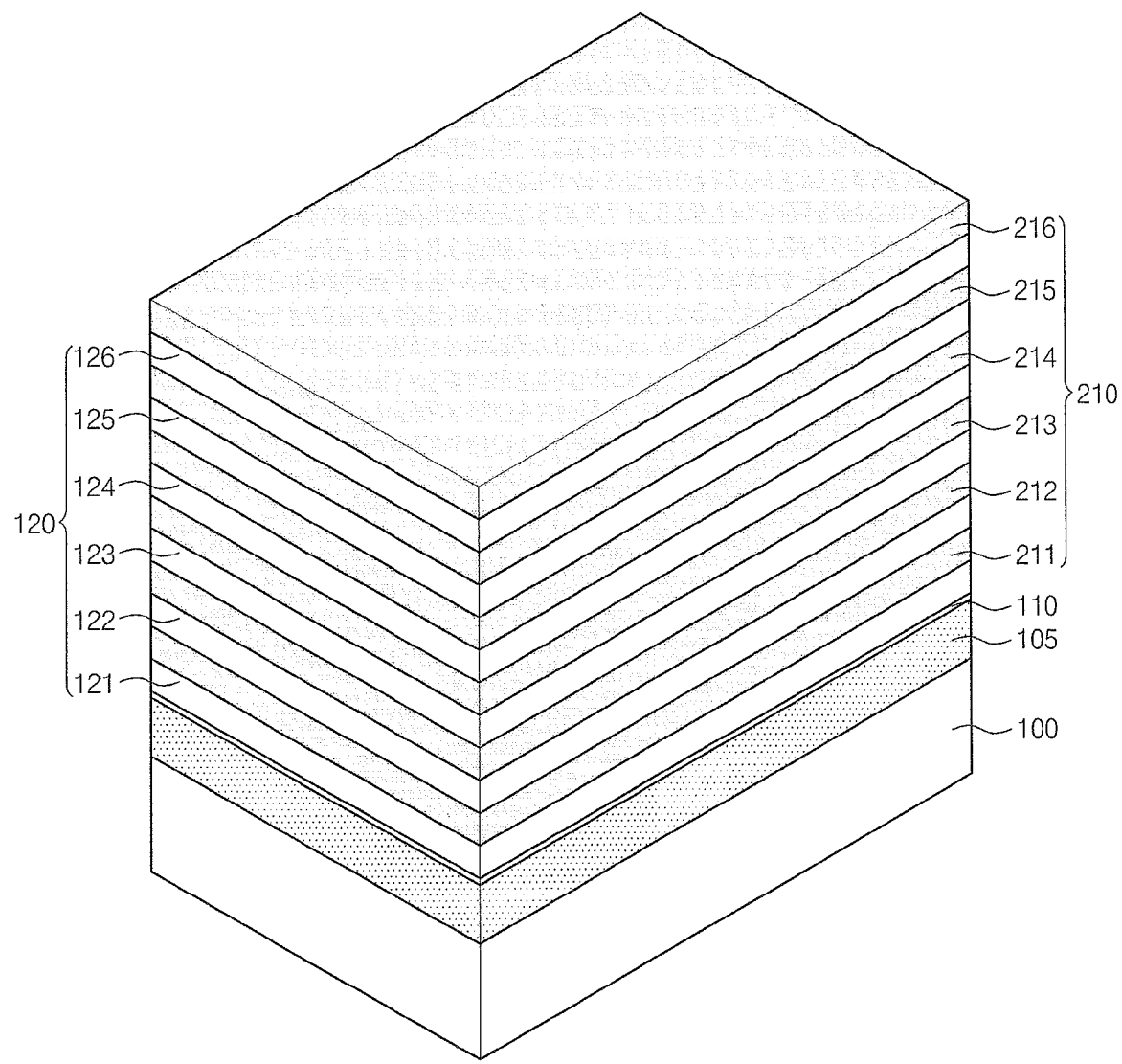
FIG. 3 to FIG. 14 are schematic perspective views illustrating a method of forming three-dimensional semiconductor memory devices according to exemplary embodiments of the present inventive concept.

Referring to FIG. 3, the semiconductor substrate 100 including the well region 105 is provided. The well region 105 may be formed by an ion injection process. The well region 105 may have an n$^+$conductivity type. Sacrificial layers 121, 122, 123, 124, 125, and 126 and gate interlayer insulation layers 211, 212, 213, 214, 215, and 216 are alternatively formed on the semiconductor substrate 100. That is, the sacrificial layers 121 to 126 are stacked to be spaced apart from one another by the gate interlayer insulation layers 211 to 216, thereby forming a sacrificial layer structure 120. The gate interlayer insulation layers 211 to 216 are interposed between the sacrificial layers 121 to 126, thereby forming a gate interlayer insulation structure 210.

The gate interlayer insulation layers 211 to 216 may be formed of at least one insulation material. For example, the gate interlayer insulation layers 211 to 216 may include at least one of silicon oxide and silicon nitride. The sacrificial layers 121 to 126 may be formed of materials that can selectively be removed while minimizing an etching of the gate interlayer insulation layers 211 to 216.

In order for a lower select line formed in a subsequent process to control effectively the potential of the semiconductor substrate 100 or the well region 105, the sacrificial layer 121 is formed beforehand on the semiconductor substrate 100 as compared to the gate interlayer insulation layer 121. That is, as illustrated in FIG. 3, the first-formed sacrificial 121 is formed adjacent to the semiconductor substrate 100 as compared to the first-formed gate interlayer insulation layer 211. A buffer layer 110 may be formed between the sacrificial layer 121 and the semiconductor substrate 100.

Figure 4:
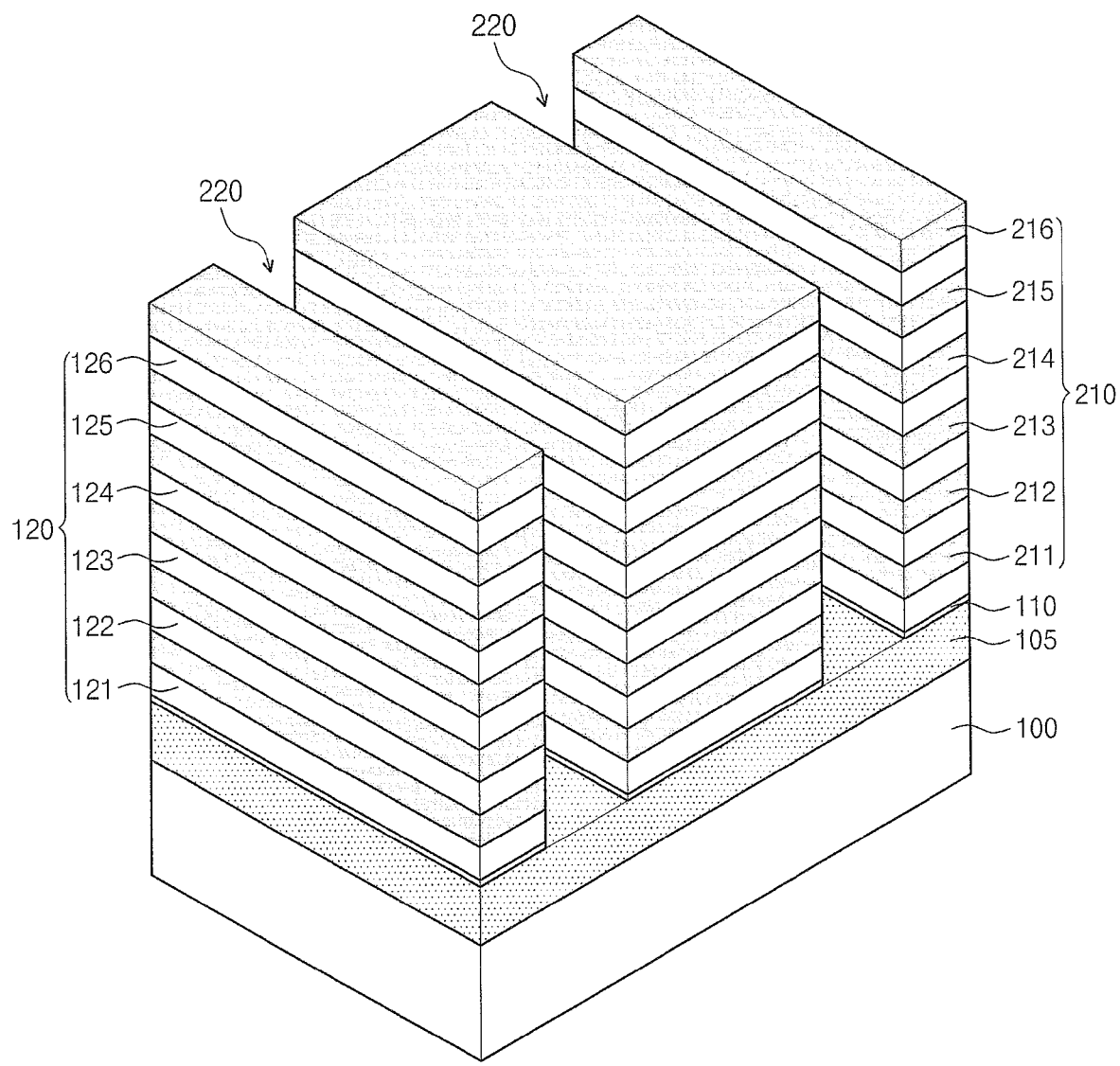
Figure 5:
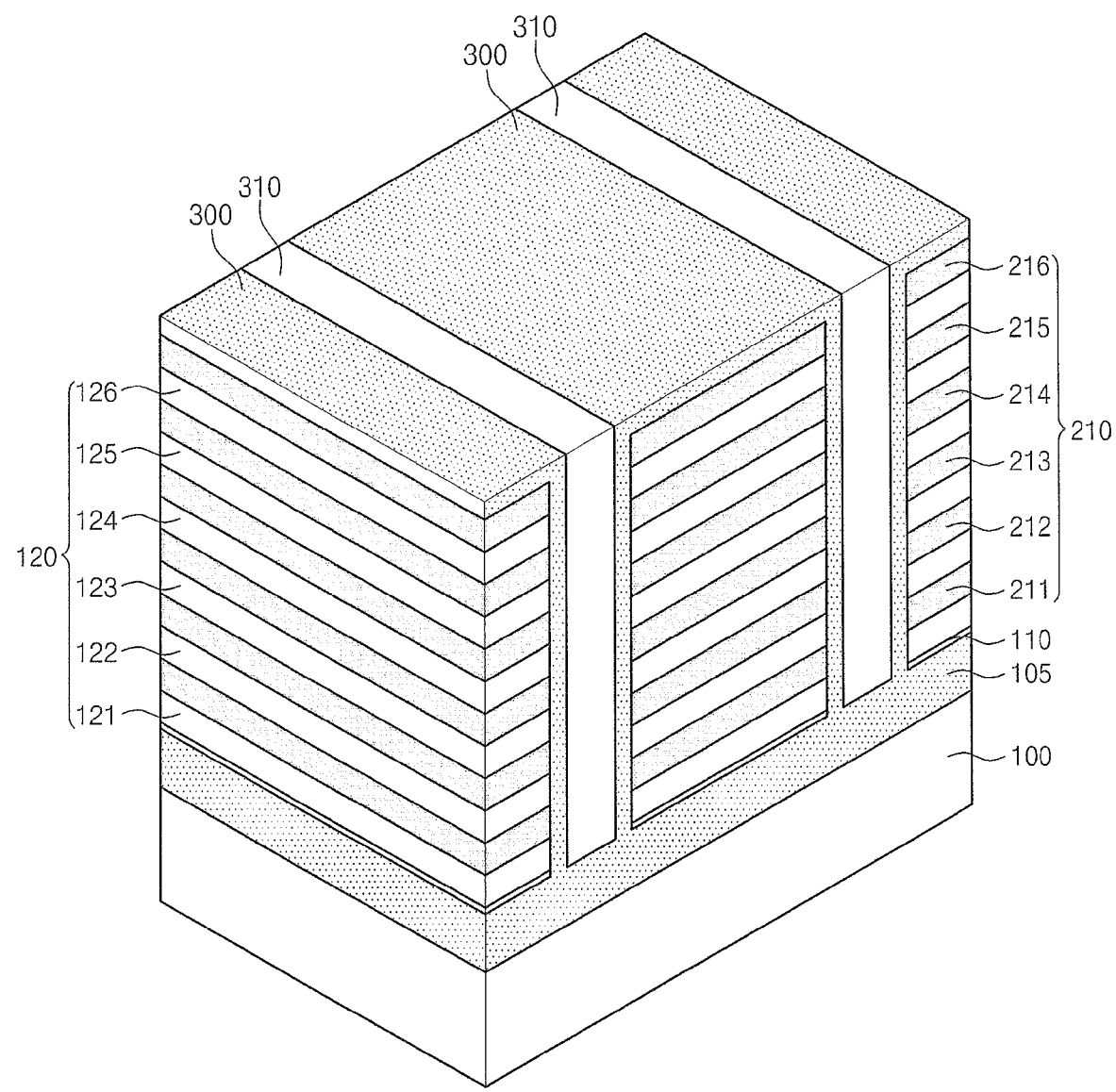

Referring to FIG. 4 and FIG. 5, openings 220 are formed by patterning the gate interlayer insulation structure 210 and the sacrificial layer structure 120 to expose the upper surface of the well region 105. Subsequently, as illustrate in FIG. 5, a semiconductor layer 300 is formed to cover an inner sidewall of the opening 220. The semiconductor layer 300 is patterned in a direction intersecting with the openings 220 to use as an active region, e.g., a channel, configuring a memory cell string. The semiconductor layer 300 may be formed to cover conformally the inner sidewall of the opening 220 by using a chemical vapor deposition process. The opening 220 provided with the semiconductor layer 300 may be filled with an insulation pillar 310. The insulation pillar 310 may be formed of, for example, silicon oxide or silicon nitride.

The semiconductor layer 300 may be formed to have the same conductivity type as the well region 105 coming in contact with the semiconductor layer 300. The semiconductor layer 300 and the well region 105 may be electrically connected to each other. Alternatively, the semiconductor layer 300 may be formed by an epitaxial process, thereby filling the opening 220.

Figure 6:
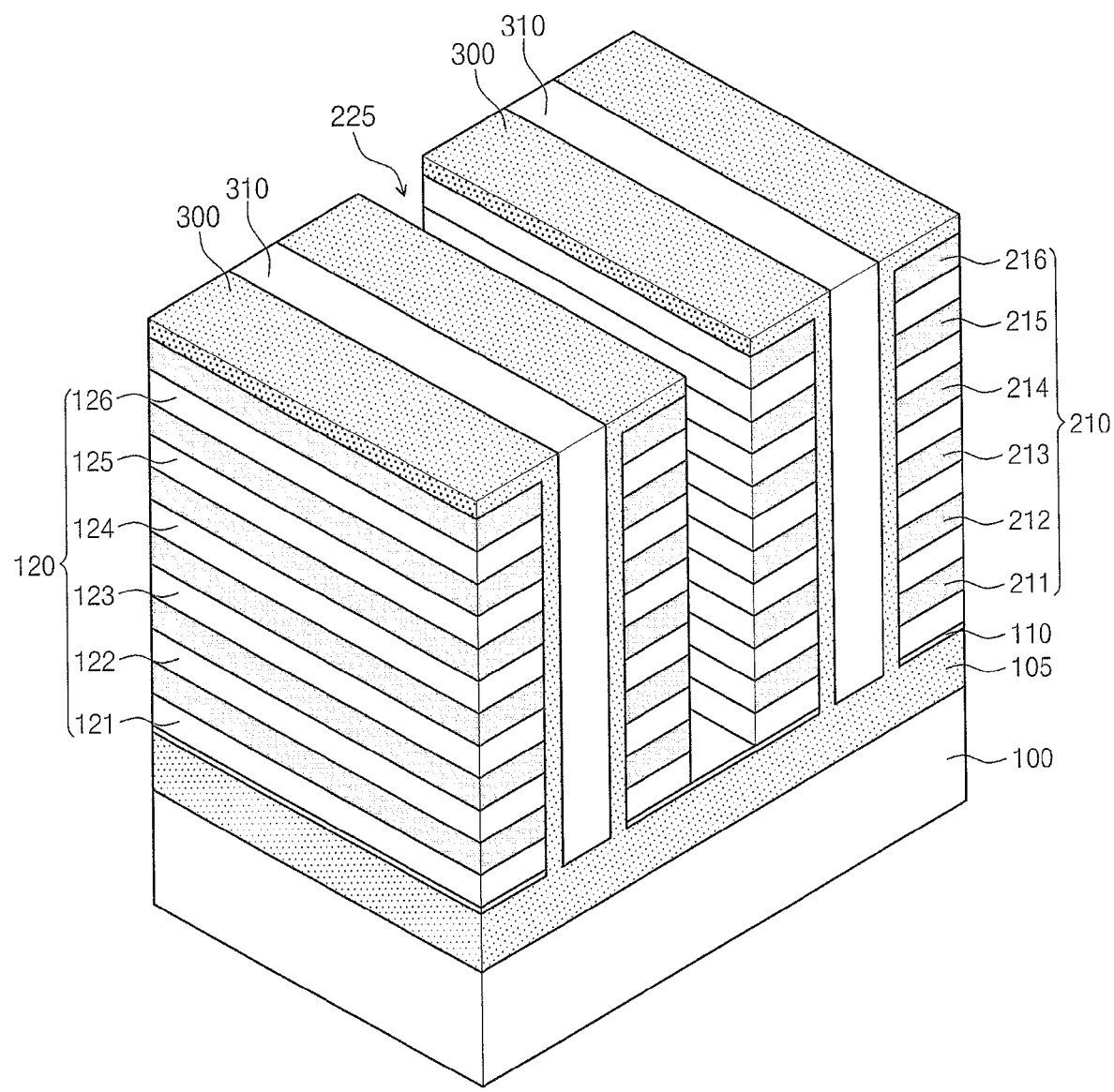

Referring to FIG. 6, a preliminary gate isolation region 225 is formed by patterning the semiconductor layer 300, the gate interlayer insulation structure 210, and the sacrificial layer structure 120 once again to expose the upper surface of the buffer layer 110 or the semiconductor substrate 100. The preliminary gate isolation region 225 may be formed between the insulation pillars 310 adjacent to each other. The semiconductor layer 300 on the uppermost gate interlayer insulation layer 216 is divided by the preliminary gate isolation region 225. The preliminary gate isolation region 225 may be formed in the direction in which the word lines extend. Preferably, the preliminary gate isolation region 225 may be formed at the center between the insulation pillars 310. For this reason, sidewalls of the gate interlayer insulation layers 211 to 216 and the sacrificial layers 121 to 126 are exposed by the preliminary gate isolation region 225. The buffer layer 110 is used as an etch stop layer. This can prevent the semiconductor substrate 100 from being excessively recessed.

Figure 7:
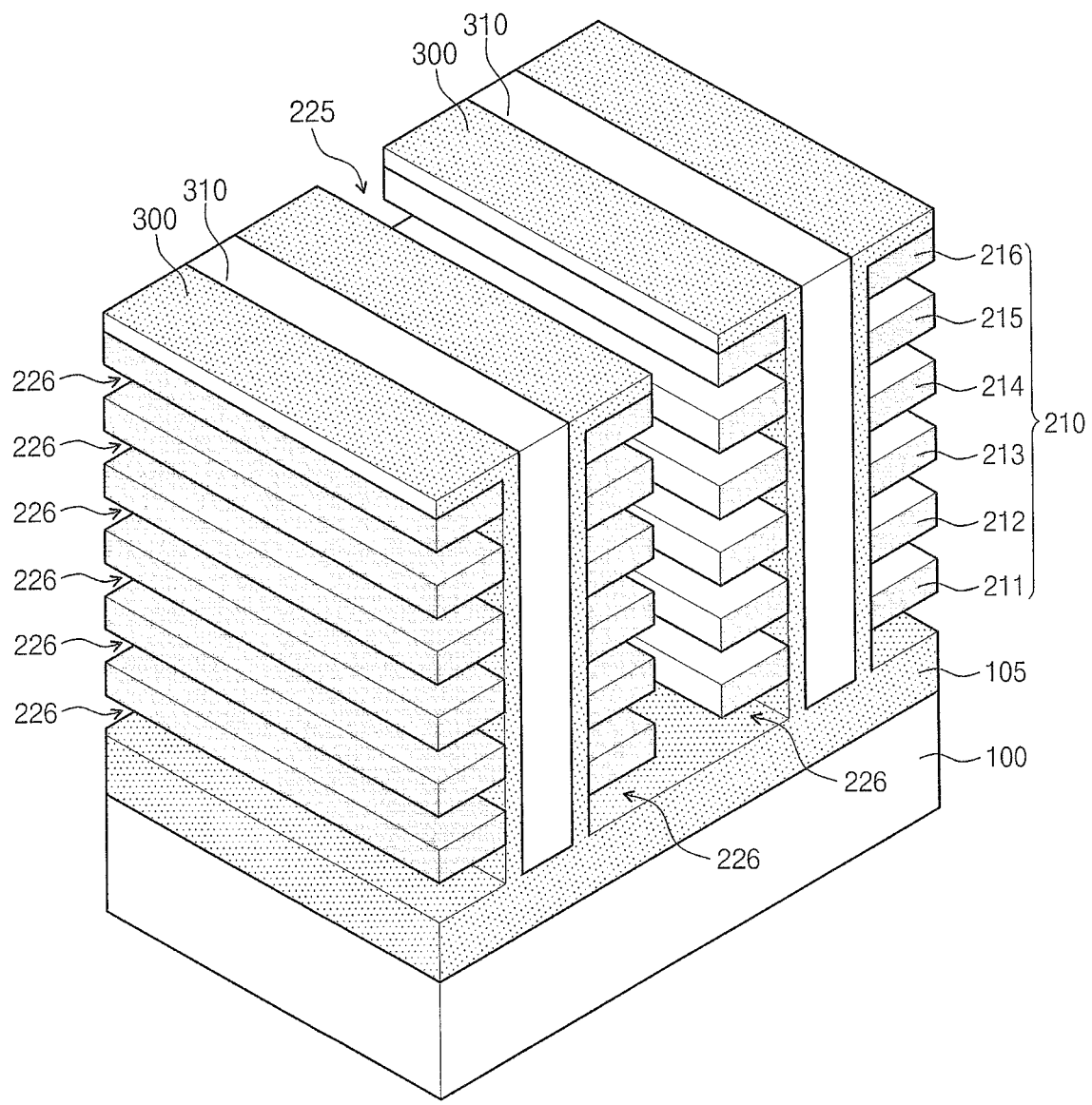

FIG. 7 illustrates a removal of the sacrificial layers 121 to 126 exposed by the preliminary gate isolation region 225. By the removal of the sacrificial layers 121 to 126, gate regions 226 are foamed between the gate interlayer insulation layers 211 to 216 to expose sidewalls of the semiconductor layer 300. During the removal of the sacrificial layers 121 to 126, the buffer layer 110 may be removed. The upper surface of the semiconductor substrate 100 may be exposed by the preliminary gate isolation region 225 and the gate regions 226.

The sacrificial layers 121 to 126 may be removed by an etching recipe having an etching selectivity with respect to the sacrificial layers 121 to 126 as compared to the gate interlayer insulation layers 211 to 216, the semiconductor substrate 100, the semiconductor layer 300, and the insulation pillar 310. The sacrificial layers 121 to 126 may be removed by an isotropic etching.

Figure 8:
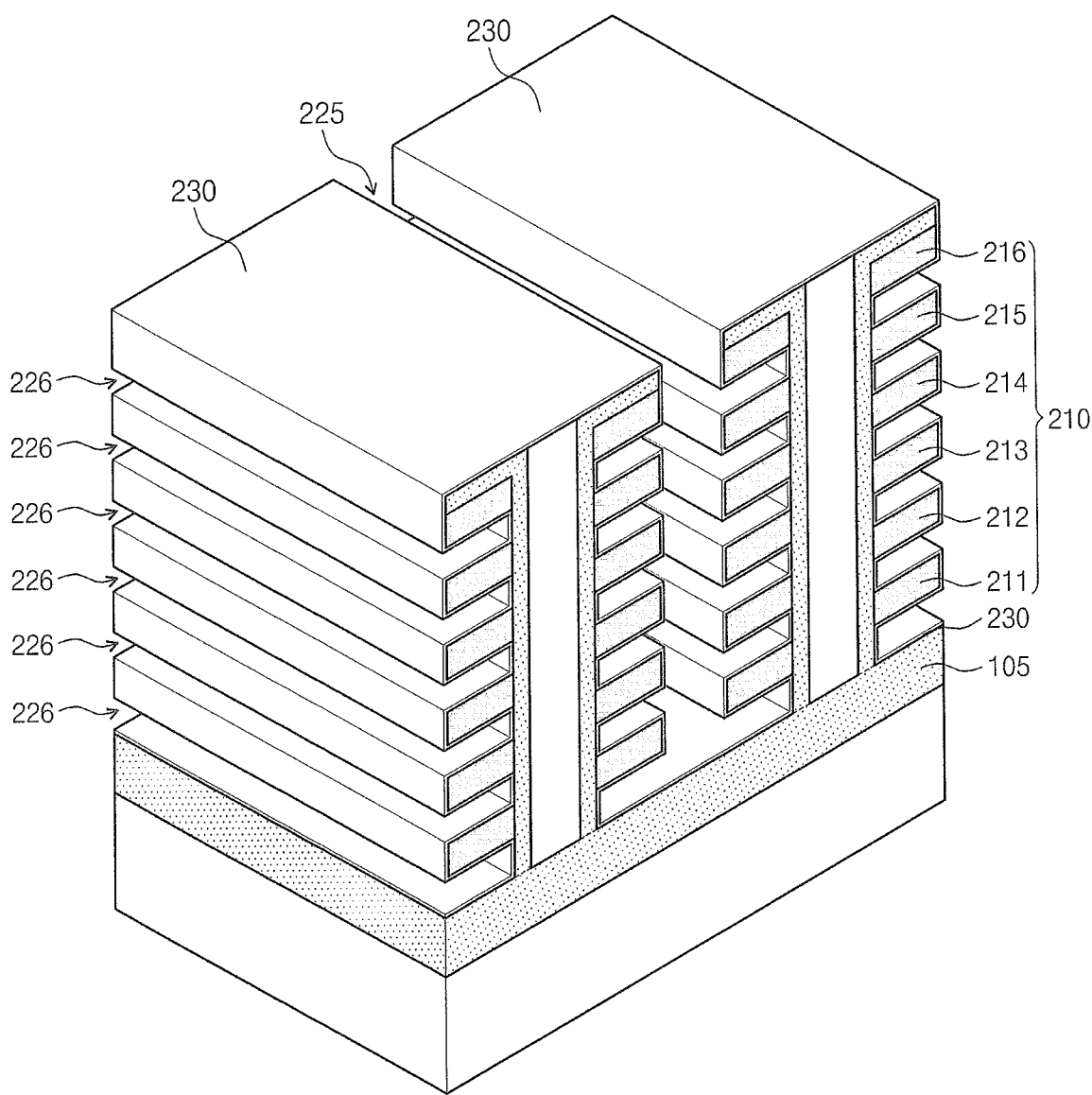

Referring to FIG. 8, a gate insulation layer 230 is formed on a resultant structure provided with the gate regions 226. The gate insulation layer 230 may include a blocking insulation layer, a charge storage layer, and a tunnel insulation layer. The tunnel insulation layer may be formed to cover the sidewall of the semiconductor layer 300 exposed by the gate regions 226, and the charge storage layer and the blocking insulation layer may be formed to cover conformally the resultant structure provided with the tunnel insulation layer.

More specifically, since the sidewall of the semiconductor layer 300 is exposed by the gate regions 226, the tunnel insulation layer may be formed by a thermal oxidation process on an exposed surface of the semiconductor layer 300. Any superficial damage of the semiconductor layer 300 may be repaired during the thermal oxidation process. The charge storage layer and the blocking insulation layer may be formed by a thin film forming technique (for example, chemical vapor deposition technique or atomic layer deposition technique) that provides good step coverage.

Figure 9:
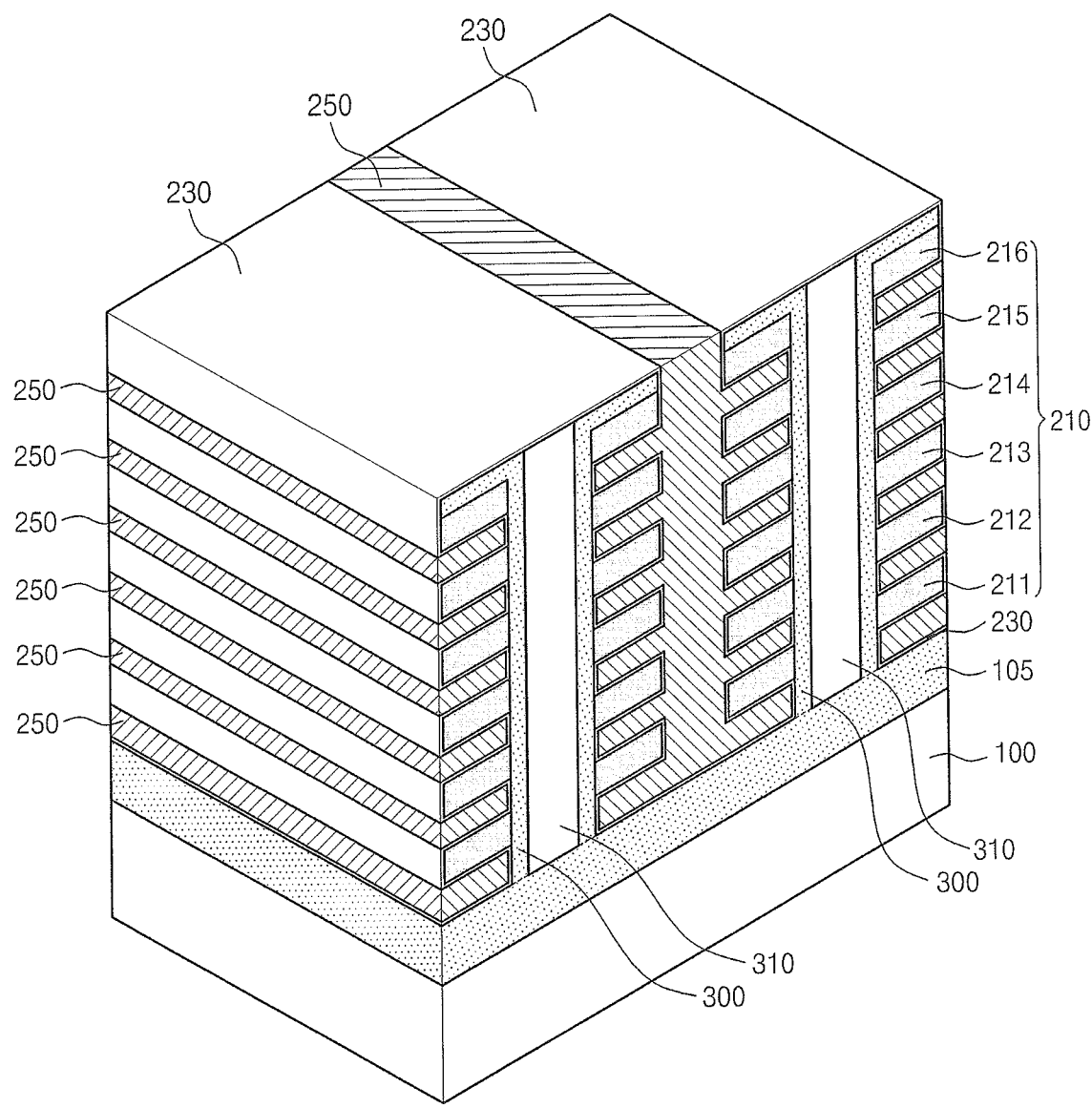

Referring to FIG. 9, a gate conductive layer 250 is formed on the resultant structure provided with the gate insulation layer 230 to fill the preliminary gate isolation region 225 and the gate region 226. The gate conductive layer 250 may be formed by at least one of the thin film forming techniques that provide good step coverage. The gate conductive layer 250 may be at least one of a polycrystalline silicon layer, silicide layers, and metal layers.

Figure 10:
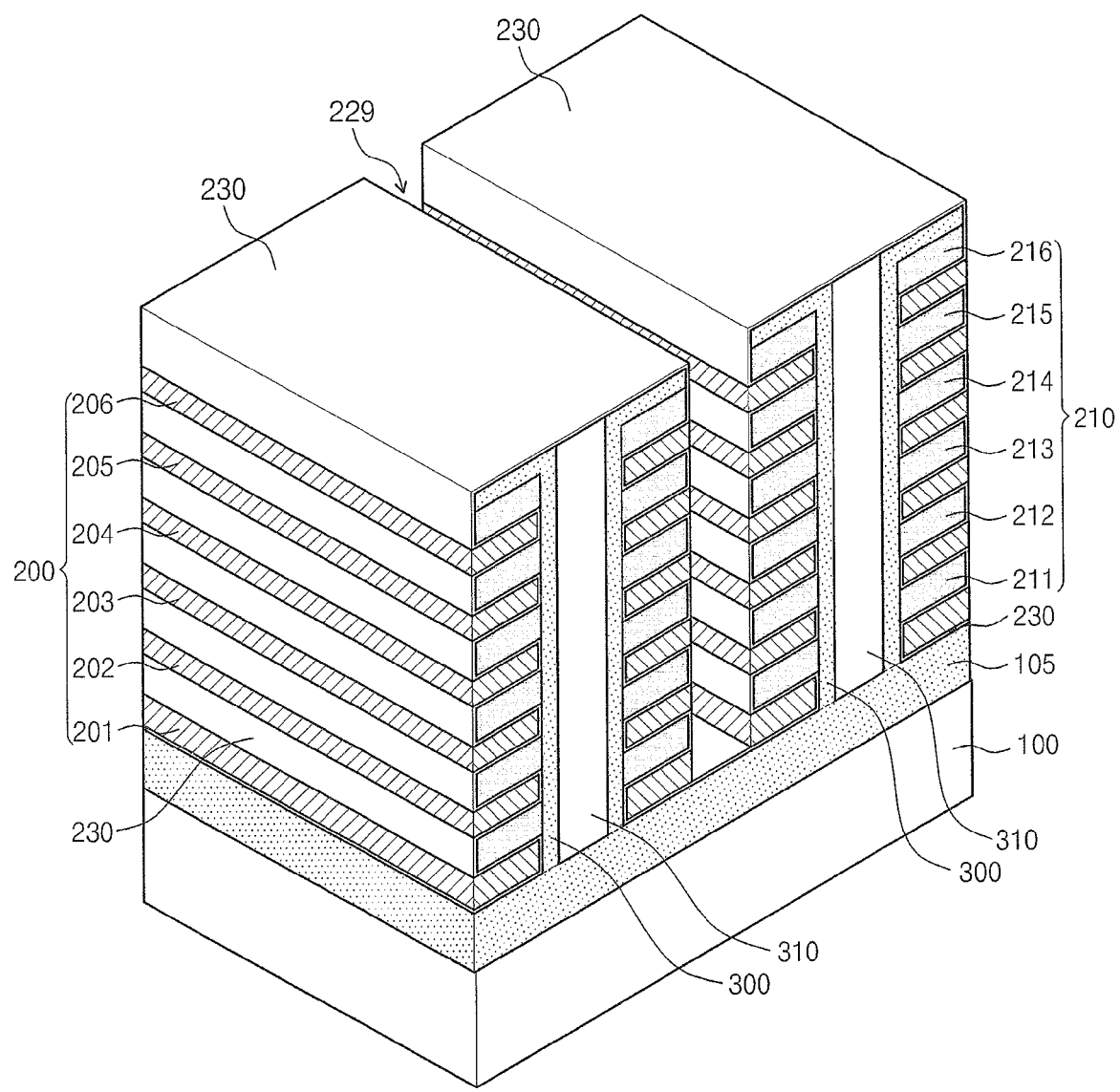

Referring to FIG. 10, a gate isolation region 229 is formed by patterning the gate conductive layer 250. The gate isolation region 229 defines the word lines 201 to 206 that are electrically isolated from each other. The word lines 201 to 206 form the word line structure 200. The word lines 201 to 206 are vertically isolated from each other by the gate interlayer insulation layers 211 to 216.

The process of forming the gate isolation region 229 may include anisotropically etching the gate conductive layer 250 using a photoresist pattern as an etching mask, after forming the photoresist pattern. In order to electrically isolate the word lines 201 to 206 from each other, the photoresist pattern may be formed to expose the area wider than the preliminary gate isolation region 225.

Figure 11:
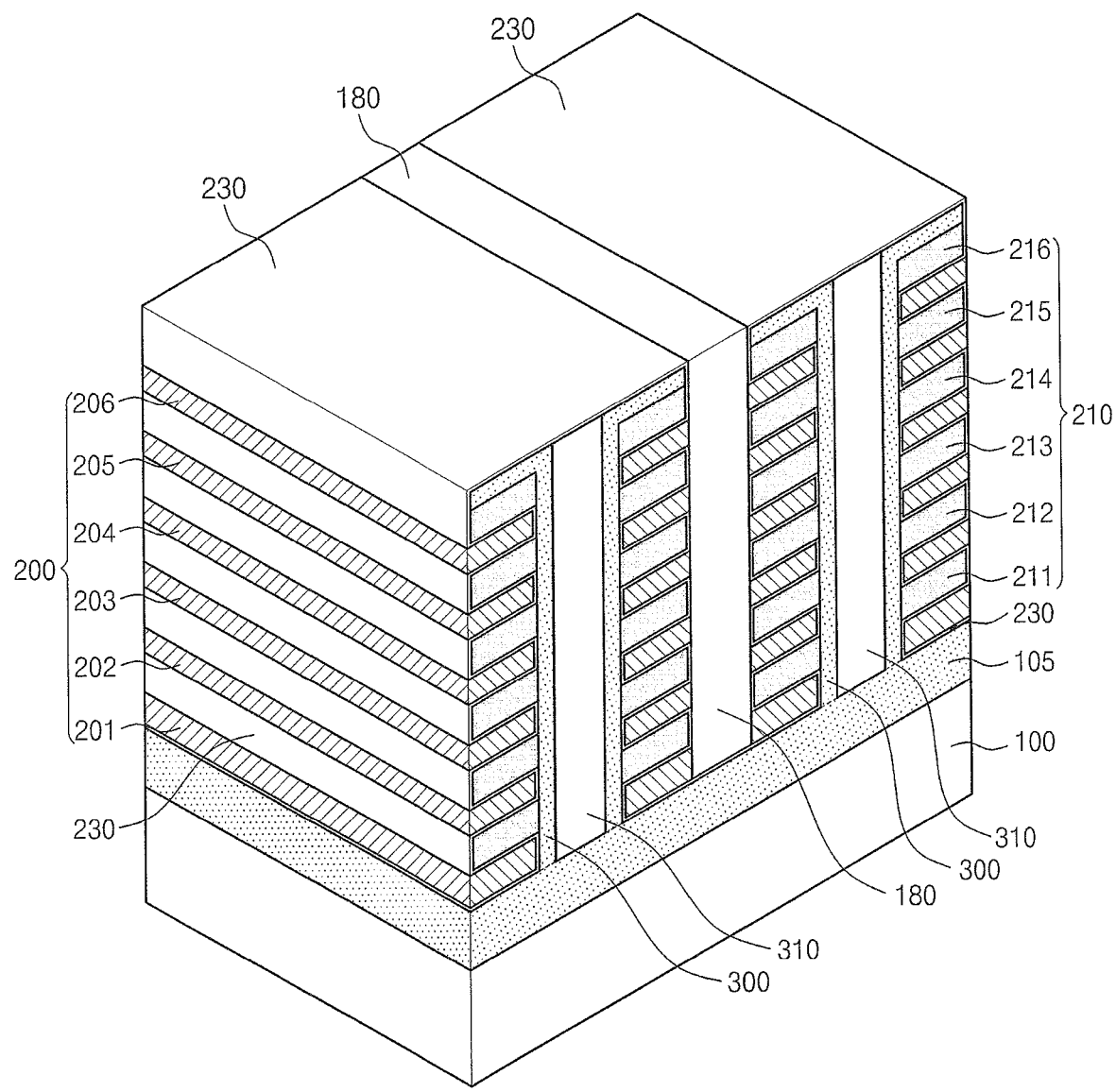
Figure 12:
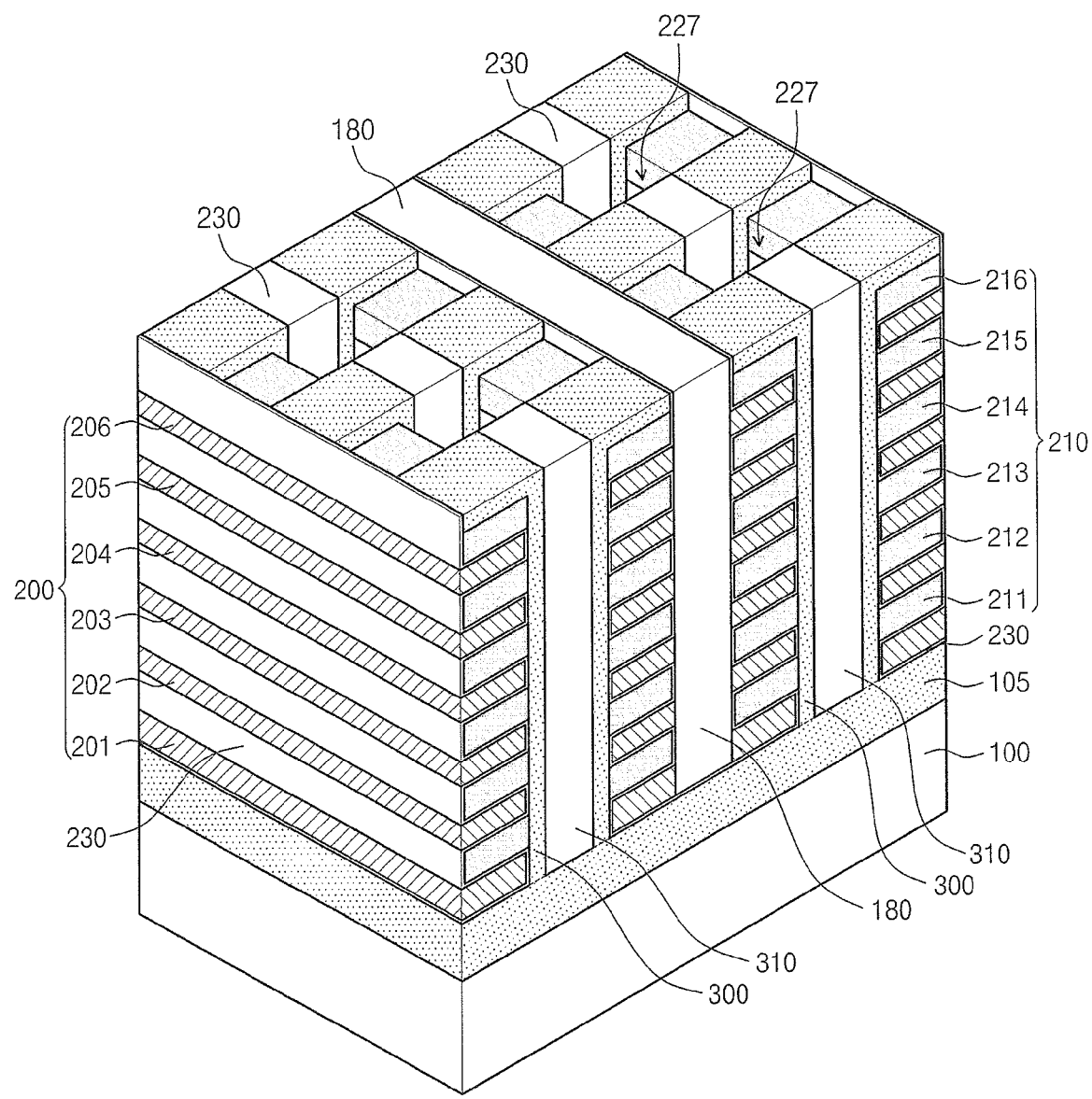

Referring to FIG. 11 and FIG. 12, after forming the gap-fill insulation layer 180 for filling the gate isolation region 229, pillar isolation regions 227 are formed by patterning the semiconductor layers 300 to isolate two-dimensionally the semiconductor layers 300 from each other, as illustrated in FIG. 12. Since the pillar isolation regions 227 are formed, the semiconductor layer 300 on the uppermost gate interlayer layer 216 of the gate interlayer insulation layers 211 to 216 is patterned. Preferably, the gap-fill insulation layer 180 is a silicon oxide layer, but is not limited thereto. That is, the gap-fill insulation layer 180 may be formed of at least one of various insulating materials. The process of patterning the semiconductor layers 300 may include anisotropically etching the semiconductor layers 300 by using the mask pattern as an etching mask in a direction intersecting with the openings 220 or the gate isolation regions 229, after forming the mask pattern to expose the semiconductor layers 300.

Figure 13:
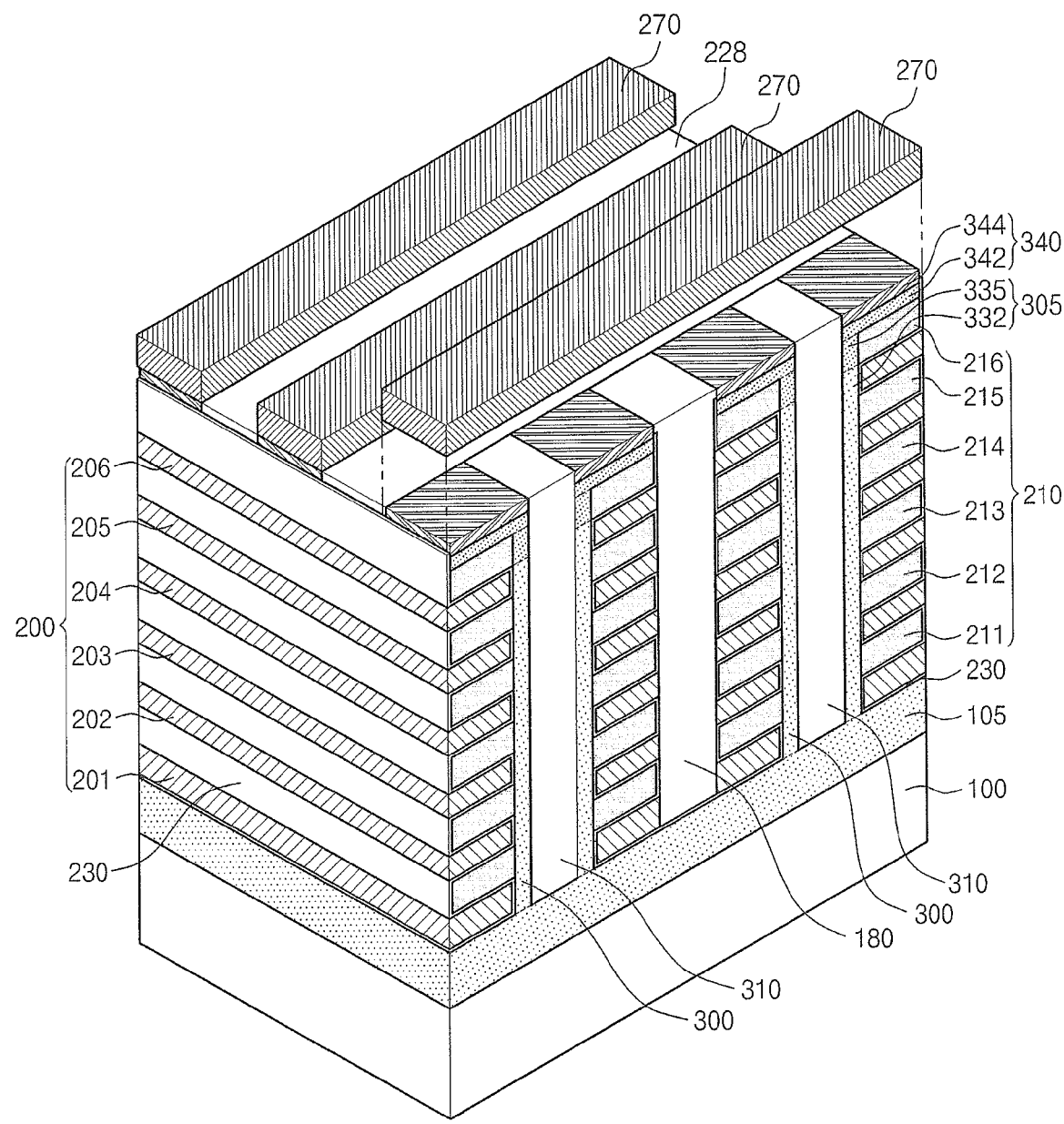

Referring to FIG. 13, an insulation-isolation pillar 228 is formed in the pillar isolation regions 227 and between the semiconductor layers 300 on the uppermost gate interlayer insulation layer 216. The insulation-isolation pillar 228 may be formed of a silicon oxide layer or a silicon nitride layer. The drain region 335 and the semiconductor pad 342 are formed by injecting ions into the semiconductor layer 300. The vertical channel layer 305 is provided with the drain region 335 formed on the semiconductor layer 300 and the body 332 used as a channel of three-dimensional memory device. Furthermore, the semiconductor pad 342 may reduce the resistance with the bit lines to be formed hereinafter. The drain region 335 may be injected with impurities having a conductivity type different from the well region 105. The semiconductor-metal compound layer 344 is formed on the semiconductor pad 342. The semiconductor-metal compound layer 344 may be a silicide. That is, the semiconductor-metal compound layer 344 may be formed by a typical silicide process. The semiconductor pad 342 and the semiconductor-metal compound layer 344 form the channel pad 340.

Bit lines 270 are formed on the channel pad 340. The channel pads 340, which are isolated from each other by the pillar isolation regions 227, are electrically connected to each other by the bit lines 270. Since the bit lines 270 and the channel pad 340 are broad in contact area and form an ohmic contact, the resistance therebetween may be small.

Figure 14:
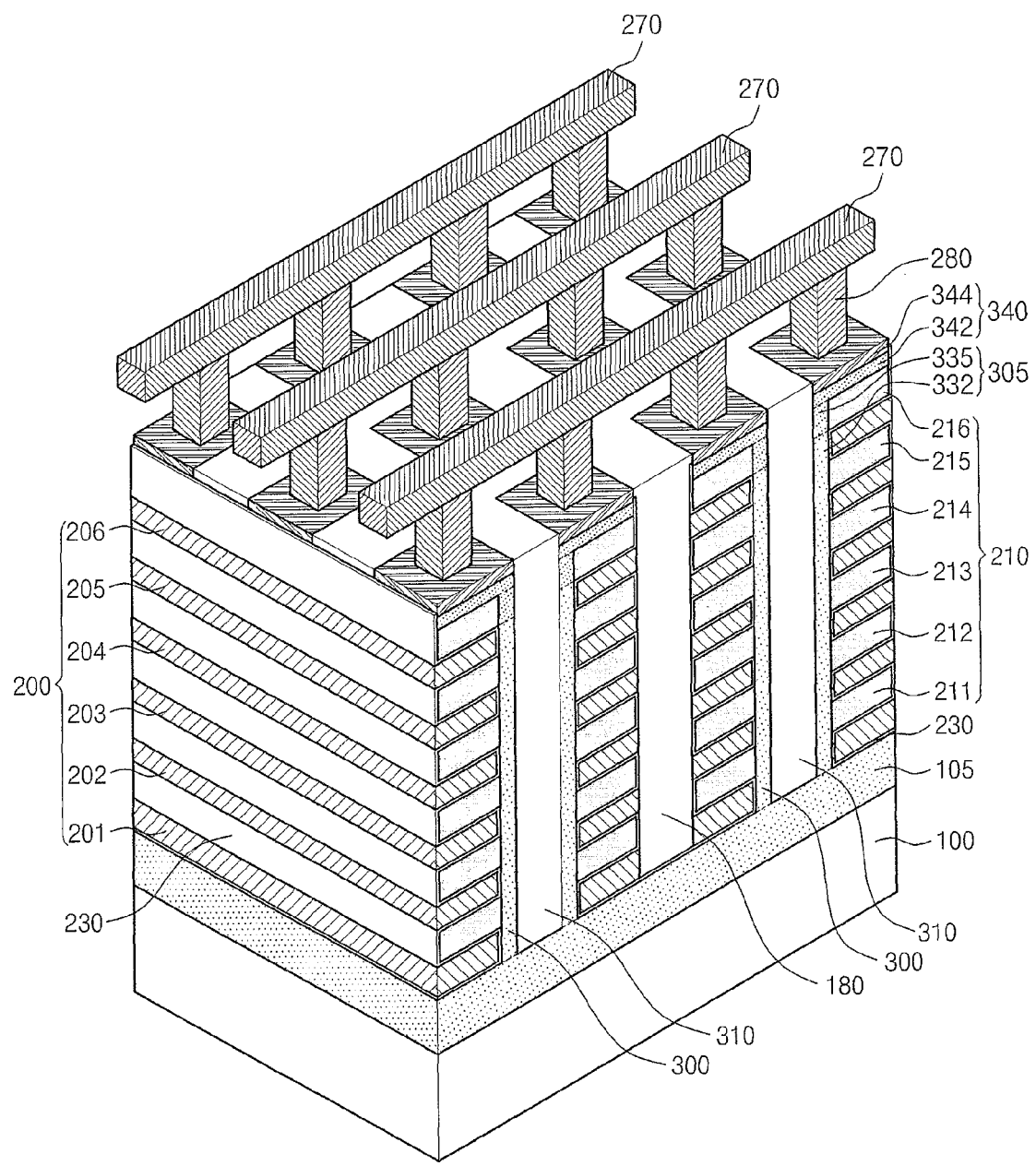

FIG. 14 is a view illustrating a three-dimensional semiconductor memory device provided with bit line contacts which are different from those of the embodiment of FIG. 13.

Referring FIG. 14, bit line contacts 280 are formed between the bit lines 270 and the channel pad 340. The bit line contacts 280 may be formed so as to each correspond one-to-one with the channel pad 340. In the process of forming the bit line contacts 280, the semiconductor-metal compound layer 344 may act as an etch stop layer. Moreover, the bit line contacts 280 may be formed by modified configurations to come in contact with the adjacent channel pad 340 at the same time.

Figure 15:
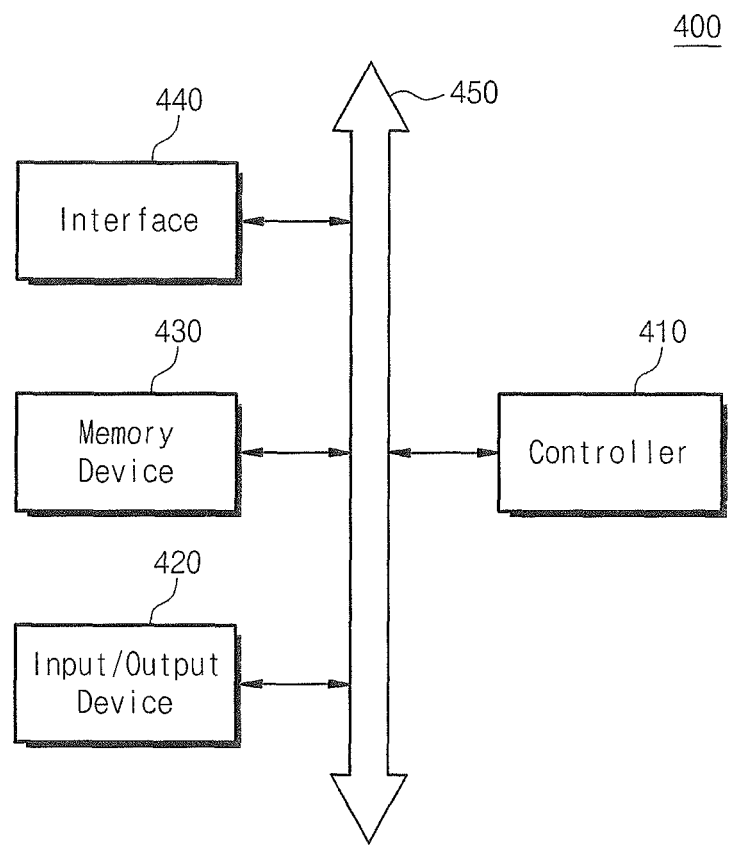
FIG. 15 is a schematic block diagram illustrating an electronic system including the three-dimensional semiconductor memory devices according to exemplary embodiments of the present inventive concept.

FIG. 15 is a block diagram illustrating an electronic system including the three-dimensional semiconductor memory devices according to exemplary embodiments of the present inventive concept.

Referring to FIG. 15, an electronic system 400 may include a controller 410, an input and output (I/O) device 420, and a memory device 430. The controller 410, the I/O device 420, and the memory device 430 may be coupled to each other via a bus 450. The bus 450 is a transfer pathway of data and/or operation signals. The controller 410 may include at least one microprocess, digital signal process, microcontroller, and at least one of logic devices that can execute functions similar to these. The I/O device 420 may include at least one selected from a keypad, a keyboard, and a display device. The memory device 430 stores data. The memory device 430 can store data and/or instructions to be executed by the controller 410. The memory device 430 may include the three-dimensional semiconductor memory device according to the above-described embodiments. The electronic system 400 may further include an interface 440 for transmitting data to a communication network or for receiving data from a communication network. The interface 440 may be in the form of wire or wireless. For example, the interface 440 may include an antenna or a wire/wireless transceiver.

The electronic system 400 can be embodied by a mobile system, personal computer, industrial computer, or system carrying out various functions. For example, the mobile system may be a personal digital assistant (PDA), portable computer, web tablet, mobile phone, wireless phone, laptop computer, memory card, digital music system, or information transmitting/receiving system. The electronic system 400 can be used in a communication interface protocol of 3G communication system such as CDMA, GSM, NADC, E-TDMA, WCDAM, and CDMA2000, when the electronic system 400 is equipment capable of carrying out wireless communication.

Figure 16:
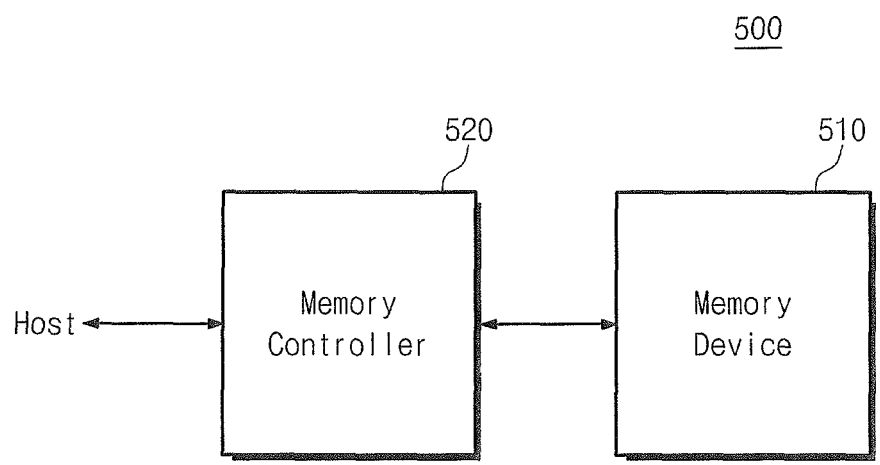
FIG. 16 is a schematic block diagram illustrating a memory card including the three-dimensional semiconductor memory devices according to exemplary embodiments of the present inventive concept.

FIG. 16 is a block diagram illustrating a memory card including the three-dimensional semiconductor memory devices according to exemplary embodiments of the present inventive concept.

Referring to FIG. 16, a memory card 500 includes a memory device 510 and a memory controller 520. The memory device 510 can store data. Preferably, the memory device 510 has non-volatile characteristics for retaining the stored data in its entirety even though the power source is interrupted. The memory device 510 may include the three-dimensional semiconductor memory device according to the above-described embodiments.

The memory controller 520 may read out data stored in the memory device 510 or may store data in the memory device 510 in response to read/write request from a host.

According to the exemplary embodiments of the present inventive concept, it is possible to reduce the wiring resistance by the channel pad coming in contact with the vertical channel layer. In addition, a silicide layer is provided in the channel pad, thereby forming an ohmic contact. Since the upper surface of the channel pad 340 is broad in area as compared to that of the vertical channel layer, it can improve an alignment margin of the bit line contacts.

Although the present inventive concept has been described in connection with the embodiment of the present inventive concept illustrated in the accompanying drawings, it is not limited thereto. It will be apparent to those skilled in the art that various substitution, modifications and changes may be thereto without departing from the scope and spirit of the inventive concept.

What is claimed is:

1. A three-dimensional semiconductor memory device comprising:
   word lines and gate interlayer insulation layers that are alternately stacked on a semiconductor substrate while extending in a horizontal direction;
   a vertical channel layer that faces the word lines and extends upwardly from the semiconductor substrate;
   a channel pad that extends from the vertical channel layer and is disposed on an uppermost gate interlayer insulation layer of the gate interlayer insulation layers; and
   at least one bit line that extends in a direction intersecting with the word lines and is electrically connected to the channel pad,
   wherein a connecting portion between the channel pad and the bit line is horizontally shifted from a central axis of the vertical channel layer.

2. The three-dimensional semiconductor memory device as set forth in claim 1, wherein the connecting portion comprises a bit line contact that is interposed between the bit line and the channel pad.

3. The three-dimensional semiconductor memory device as set forth in claim 2, wherein a central axis of the bit line contact is horizontally shifted from the central axis of the vertical channel layer.

4. The three-dimensional semiconductor memory device as set forth in claim 1, wherein the connecting portion vertically overlaps with the word lines.

5. The three-dimensional semiconductor memory device as set forth in claim 4, wherein the connecting portion extends on the vertical channel layer.

6. The three-dimensional semiconductor memory device as set forth in claim 1, wherein the vertical channel layer is a first vertical channel layer and the three-dimensional semiconductor memory device further comprises:
   a second vertical channel layer adjacent and parallel the first vertical channel layer; and
   an insulation pillar between the first and the second vertical channel layers.

7. The three-dimensional semiconductor memory device as set forth in claim 1, wherein an upper surface of the channel pad has an area larger than that of the vertical channel layer.

8. The three-dimensional semiconductor memory device as set forth in claim 1, further comprising the gate insulation layer including a blocking insulation layer, a charge storage layer, and a tunnel insulation layer between the word lines and the vertical channel layer.

9. The three-dimensional semiconductor memory device as set forth in claim 1, wherein the vertical channel layer includes a drain region that comes in contact with the channel pad.

10. A three-dimensional semiconductor memory device comprising:
    word lines and gate interlayer insulation layers that are alternately stacked on a semiconductor substrate while extending in a horizontal direction;
    a vertical channel layer that faces the word lines and extends upwardly from the semiconductor substrate;
    a channel pad that extends from the vertical channel layer and is disposed on a top surface of an uppermost gate interlayer insulation layer of the gate interlayer insulation layers;
    at least one bit line that extends in a direction intersecting with the word lines and is electrically connected to the channel pad; and
    a bit line contact that is interposed between the bit line and the channel pad,
    wherein the bit line contact is horizontally shifted from a central axis of the vertical channel layer, and
    wherein a width of the channel pad is greater than a thickness of the vertical channel layer.

11. The three-dimensional semiconductor memory device as set forth in claim 10, wherein the bit line contact is shifted in an extending direction of the channel pad.

12. The three-dimensional semiconductor memory device as set forth in claim 10, wherein the vertical channel layer includes:
    a drain region that comes in contact with the channel pad; and
    a body below the drain region,
    wherein a conductivity type of the drain region different from that of the body.

13. The three-dimensional semiconductor memory device as set forth in claim 10, wherein both the vertical channel layer and the channel pad include a semiconductor.

* * * * *